United States Patent
Murakami

(10) Patent No.: US 6,320,262 B1
(45) Date of Patent: *Nov. 20, 2001

(54) SEMICONDUCTOR DEVICE AND MANUFACTURING METHOD THEREOF

(75) Inventor: Akishige Murakami, Sendai (JP)

(73) Assignee: Ricoh Company, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/205,854

(22) Filed: Dec. 4, 1998

(30) Foreign Application Priority Data

Dec. 5, 1997 (JP) .................................. 9-335222

(51) Int. Cl.[7] .......................... H01L 23/48; H01L 23/52; H01L 23/40
(52) U.S. Cl. .......................... 257/758; 257/759; 257/762; 257/763; 257/760; 257/773; 257/774; 257/767; 257/920; 257/919
(58) Field of Search ................. 257/773, 774, 257/767, 758, 759, 760, 762, 763, 920, 919

(56) References Cited

U.S. PATENT DOCUMENTS

| | | | |
|---|---|---|---|
| 5,502,337 | * 3/1996 | Nozaki | 257/773 |
| 5,736,791 | * 4/1998 | Fujiki et al. | 257/781 |
| 5,739,587 | * 4/1998 | Sato | 257/758 |
| 5,847,466 | * 12/1998 | Ito et al. | 257/775 |
| 5,900,735 | * 5/1999 | Yamamoto | 324/537 |

FOREIGN PATENT DOCUMENTS 60227444   11/1985   (JP) .

OTHER PUBLICATIONS

"Permitted Electromigration of Tungsten–Plug Vias In Chain For Test Structure With Short Inter–Plug Distance" T. Aoki, Y. Kawano and T. Nogami, Jun. 7, 1994 and Jun. 8, 1994, pp. 266–272.

* cited by examiner

Primary Examiner—Minh Loan Tran
Assistant Examiner—Luan Thai
(74) Attorney, Agent, or Firm—Cooper & Dunham LLP

(57) ABSTRACT

The present invention aims at improving the lifetime of the wiring connecting to the hole nearest to the bonding pad and thereby improving the reliability of the semiconductor device. The invention relates to such semiconductor device and method of manufacturing the semiconductor device. The semiconductor device includes a plurality of first metal layers connected to a bonding pad, and plurality of aluminum wirings respectively connected to the first metal layers. The plurality of aluminum wirings are connected to a single second metal layer and have a length equal to or short than Blech Length.

28 Claims, 8 Drawing Sheets

SEMICONDUCTOR DEVICE AND MANUFACTURING METHOD THEREOF

BACKGROUND OF THE INVENTION

1. Field of the Invention

The present invention relates to a semiconductor device including a bonding pad for use in inputting/outputting electrical signals and a method of manufacturing the semiconductor device.

2. Discussion of the Related Art

When a voltage is applied to aluminum (Al) wirings, Al atoms drift by electromigration (hereinafter, called "EM").

The velocity of the diffusion flow (atomic flux) by EM is represented by the below equation (1).

On the other hand, when Al atoms drift, since a density gradient occurs in the aluminum wiring, a stress gradient occurs which negates the density gradient. The stress gradient acts to prevent drift of Al atoms by EM. Thereby, a so-called back flow effect may occur. The velocity of the diffusion flow (atomic flux) by back flow effect is represented by the below equation (2).

$$J_{EM} = (D_a \cdot N \cdot j \cdot e \cdot \rho \cdot Z)/kT \quad (1)$$

$$J_{SG} = (D_a/kT)(\Delta\delta(x)/\Delta x) \quad (2)$$

Here, Da is a diffusion coefficient, N an atom density, T an absolute temperature, j a current density, e a principle electric charge, ρ an electric conductivity, Z an effective electric charge of metal, δ a stress in the longitudinal direction of the wiring, and k a Boltzmann Constant.

In such situation, when the diffusion flow velocity (atomic flux) induced by EM is well balanced with that induced by the stress gradient, Al atoms do not move at all, although in practice, the flow velocity (atomic flux) may not be zero. However, the value thereof becomes very small. The length of the aluminum wiring at which this balanced effect occurs is called "Blech Length". That is, wiring of a length equal to or shorter than Blech Length will show little or no movement of Al atoms. Wiring of a length longer than Blech Length will show substantially more movement of Al atoms. It is well known that wiring not longer than Blech Length has a very long lifetime, compared to wiring that is longer then Blech Length.

Furthermore, for aluminum wiring having a width and current density in the subhalf-micron generation range, Blech Length can be estimated to be about 20 μm.

Generally, writings of the subhalf-micron generation range are formed with aluminum wirings, and contact holes and via-holes are filled with tungsten (W). When a voltage is applied to the wirings, the Al atoms drift by EM and the diffusion flow velocity (atomic flux) is interrupted at interfaces of the contact holes and the via-holes. Consequently, Al accumulation/depletion occurs at the interfaces, and hillocks and voids may occur, which can result in failure. Regarding the holes themselves, since tungsten (W) has larger EM-resistance than aluminum, W accumulation/depletion does not occur in the holes. Therefore, additional failure does not occur.

In the article, "Permitted electromigration of tungsten-plug vias in chain for test structure with short inter-plug distance" of VMIC 266–272(1994), a method of improving the lifetime of the aluminum wiring is reported. In FIG. 8, a structure capable of improving the lifetime of the aluminum wiring is illustrated. In such structure, the distance between the holes 21 which are filled with W, is not longer than Blech Length. By making the length of the aluminum wiring between holes 21 not longer than Blech Length, the lifetime of the aluminum wiring can be improved.

However, the distance between the bonding pad 22 and the hole 21 nearest to the bonding pad 22 is usually about 50–100 μm. Accordingly, this aluminum wiring typically cannot be made the same or shorter than Blech Length. As a result, in the neighborhood of the hole 21 nearest to the bonding pad 22, the lifetime of the wiring decreases.

The structure of the bonding pad has been proposed in the published specification of Japanese Laid-open Patent Publication No. 60-227444/1985. In the structure, the bonding pad is formed with plural aluminum layers and holes for connecting the plural aluminum layers with each other. However, since the holes formed in the bonding pad are filled with upper aluminum layers of the bonding pad, the lengths of the bonding pad and the bonding wire are regarded as part of the wiring length in the hole nearest to the bonding pad as in the background case mentioned above. Accordingly, the length of the aluminum wiring is typically longer than Blech Length. Consequently, the lifetime of the wiring is decreased in the neighborhood of the hole nearest to the bonding pad.

SUMMARY OF THE INVENTION

The present invention was made in consideration of the above-mentioned problems in order to improve such various subject matters to be solved.

It is an object of the present invention to solve the above defects of the background technology.

It is another object of the present invention to improve the reliability of the semiconductor device by improving the lifetime of the wiring to be connected to the hole nearest to the bonding pad.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
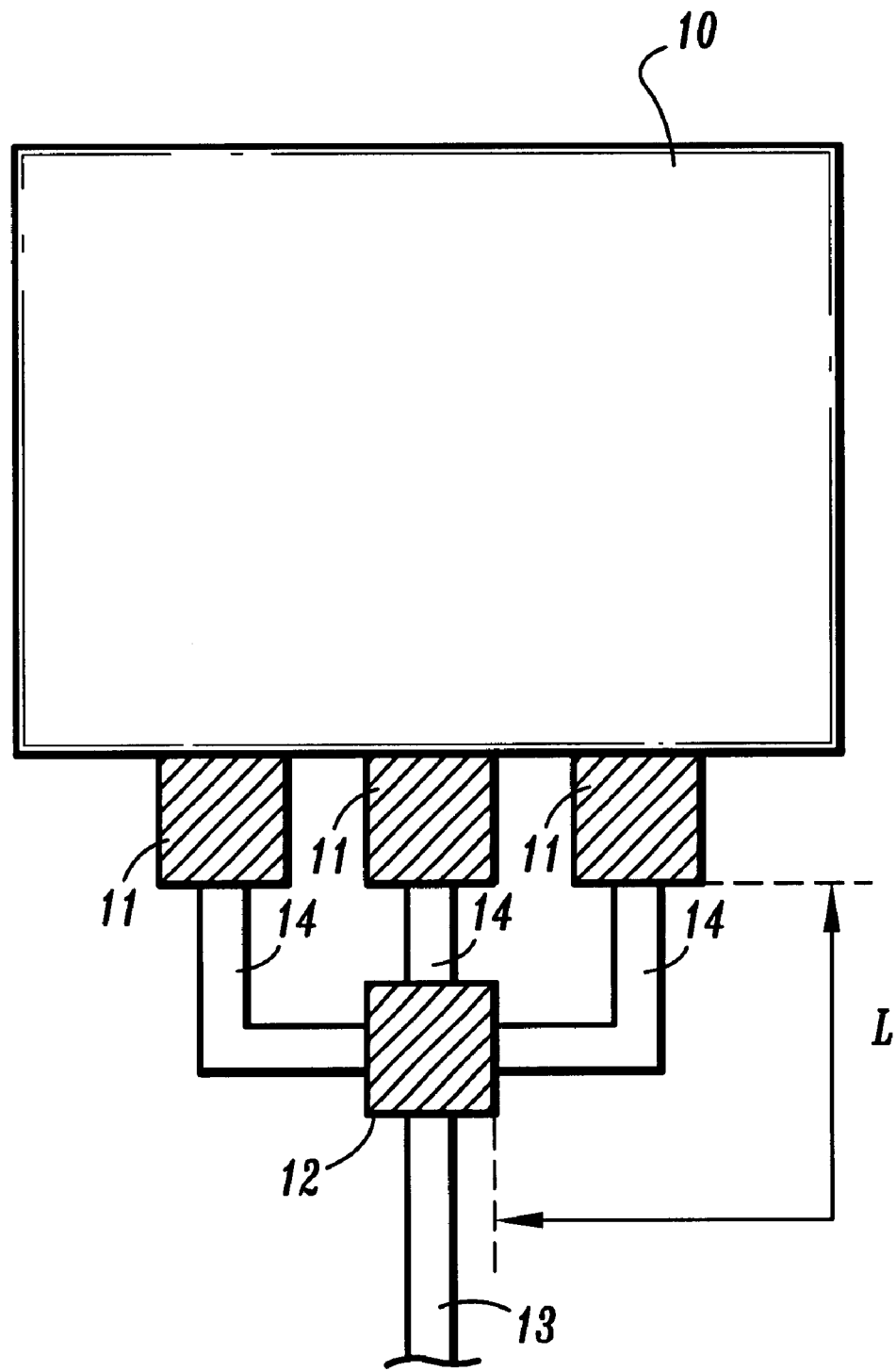
FIG. 1 is a plan view showing the first embodiment of the present invention.

Referring now to the drawings, wherein like reference numerals designate identical or corresponding parts throughout the several views, and more particularly to FIG.

Figure 7:
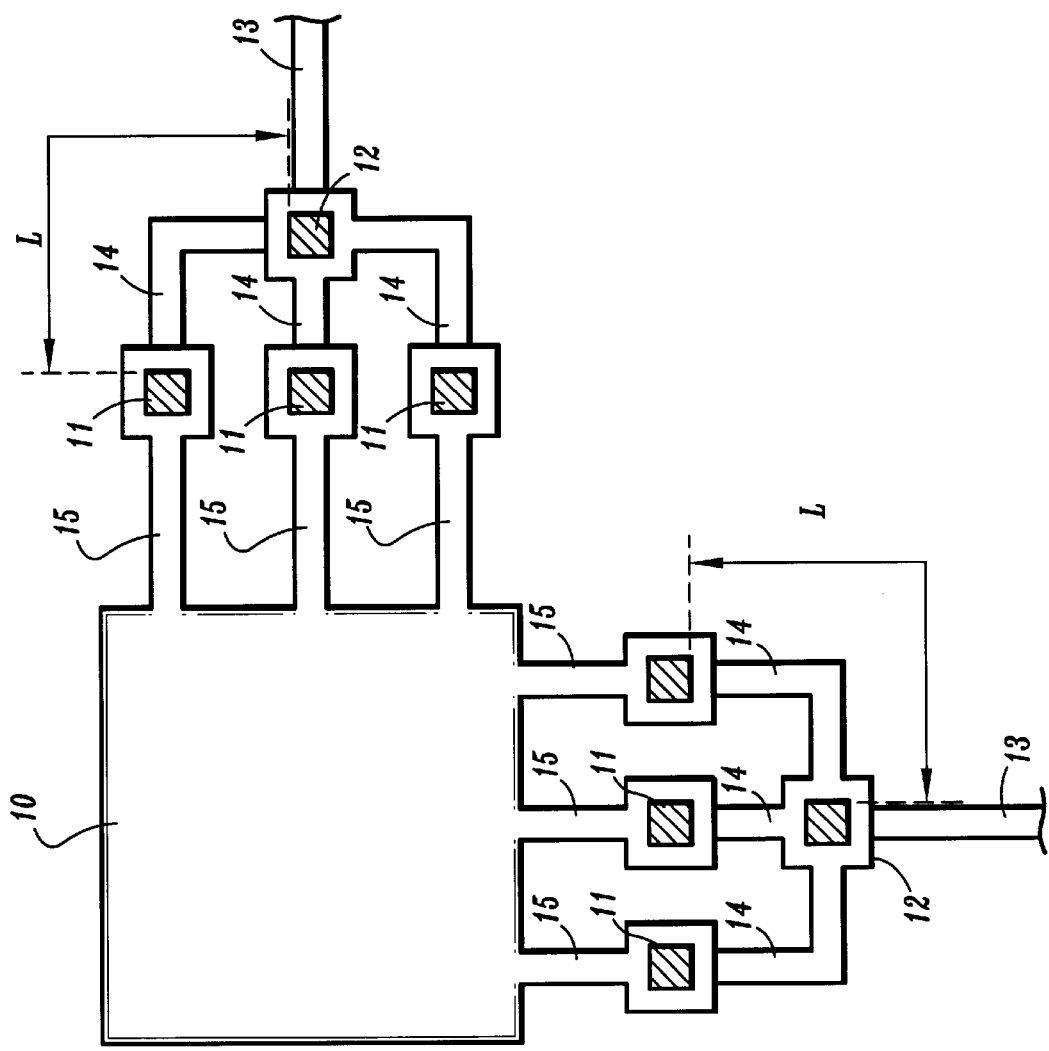
FIG. 7 is a plan view showing the fifth embodiment of the present invention.
Figure 8:
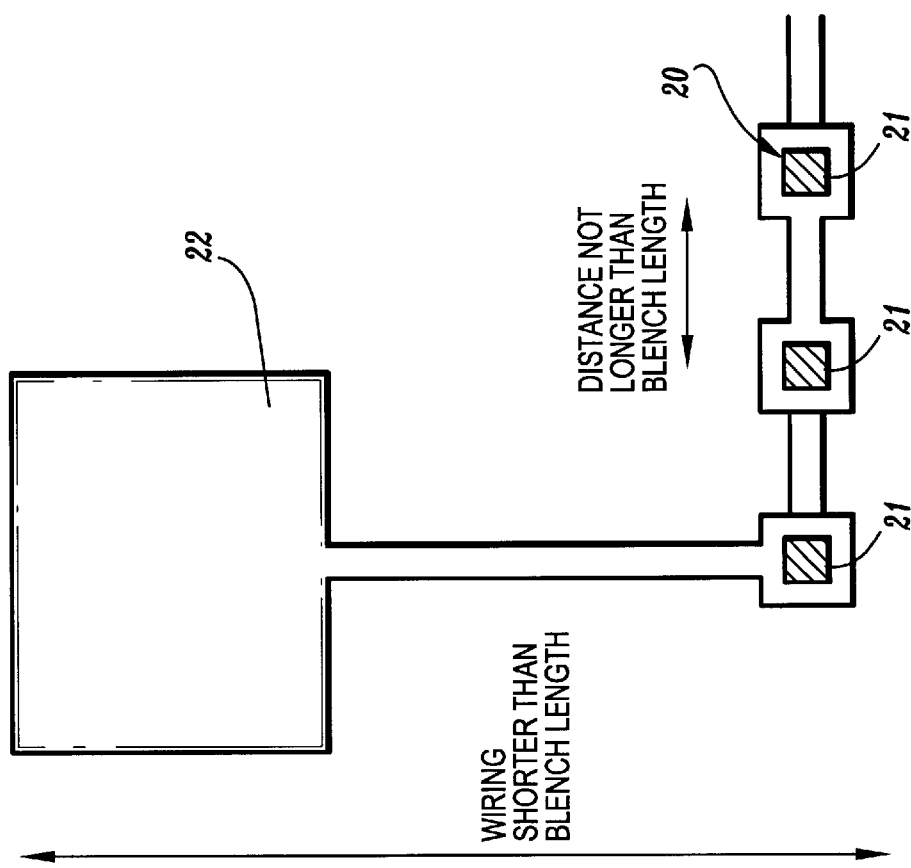
FIG. 8 is a plan view of a background semiconductor device.

1 through FIG. 7 thereof, there are respectively illustrated a semiconductor device and method of manufacturing the semiconductor device according to the present invention.

The semiconductor device of the present invention is provided with a bonding pad, a plurality of first metal layers connected to the bonding pad, a plurality of aluminum wirings respectively connected to the first metal layers, and a single second metal layer. The plurality of aluminum wirings have a length equal to or shorter than Blech Length and are connected to the single second metal layer.

In the above-mentioned semiconductor device, since the length of the aluminum wirings is not longer than Blech Length, voids and hillocks do not occur on the interfaces of the first and second metal layers, and thereby the lifetime of the wirings can be remarkably improved. Furthermore, in the connection between the bonding pad and the first metal layers, since the first metal layers are provided in plural sections, EM lifetime may become longer, compared with the case of a single first metal layer. As a result, even in the connection between the bonding pad and the first metal layers, a long lifetime thereof can be realized. Consequently, the lifetime of the aluminum wirings can be remarkably improved in the neighborhood of the bonding pad. As a result, the reliability of the semiconductor device can be improved.

The aforementioned first and second metal layers can be composed of a single-layered type or multiple-layered type metal layer made of tungsten.

According to the above-mentioned structure, both a selective tungsten chemical vapor deposition system and a blanket tungsten chemical vapor deposition system employed in the subhalf-micron generation range can be used as the tungsten deposition system. In such structure, increase of the manufacturing costs can be suppressed and reliability of the semiconductor device can be improved. In such way, by adopting (the method of) the existing hole filling systems, the improvement of the wiring lifetime can be realized while any increase of the manufacturing costs is suppressed.

The aforementioned first and second metal layers are the single-layered type or multiple-layered type metal layers composed of tungsten filling the holes formed in same or different insulation films. Furthermore, the plural aluminum wirings connected to the first metal layers exist in contact with the interface(s) of the same or different insulation film(s) where the first and second metal layers are formed.

According to the above-mentioned structure, at least when the circuit block is fabricated by two or more (level) aluminum wirings, the first and second metal layers can be formed at the same time that the via-holes of the circuit block are filled with the first and second metal layers, and thereby the plural aluminum wirings can be formed at the same time that the aluminum wirings of the circuit block are formed. Consequently, since such structure can be manufactured without adding any new processes to the background processes, the increase of the manufacturing cost can be further suppressed and the reliability of the semiconductor device can be improved.

Furthermore, according to an embodiment of the present invention, all of the aforementioned first and second metal layers and the plural aluminum wirings connected to the first metal layers can be located under the bonding pad and in the area occupied by the bonding pad.

According to the above-mentioned structure, since the first and second metal layers and the plural aluminum wirings connected to the first metal layers are formed under the bonding pad, the required area does not widen, compared with the background bonding pad. Furthermore, when the present invention is adopted for the background semiconductor device, it may be sufficient to change only the bonding pad, and thereby the modification of the lay-out may become very simple. In such way, when the structure of the present invention is located under the bonding pad, the improvement of the wiring lifetime can be realized while suppressing any increase of the required chip area of the semiconductor device. In addition, when the present invention is adopted for the background semiconductor device, the cost-up by the modification of the lay-out can be made as low as possible.

In the aforementioned embodiments, a single second metal layer is used. However, it is possible to provide plural second metal layers. When a plurality of second metal layers are used, it may be possible to provide plural connecting points to the circuit block. Thereby, lay-out margin in the neighborhood of the bonding pad may be improved (larger), and the design rule can be shrunk for the semiconductor device.

Hereinafter, the embodiments of the present invention are described, referring to the accompanying drawings.

First Embodiment

FIG. 1 is a plan view showing the first embodiment of the present invention.

As shown in FIG. 1, a plurality of first metal layers 11, having an EM-resistance larger than that of aluminum, are connected to a bonding pad 10, and a plurality of aluminum wirings 14 are connected to the respective first metal layers 11. The aluminum wirings 14 are connected to a second metal layer 12 having an EM-resistance larger than that of aluminum. Aluminum wirings 13 are connected to the single second metal layer 12 and connected to a circuit block (not shown).

Moreover, assuming that the length of the longest aluminum wiring among the plurality of aluminum wirings 14, provided between the first metal layers 11 and the second metal layer 12 is L, the length L is equal to or shorter than Blech Length.

By adopting the above-mentioned structure, since the aluminum wirings 14 are not longer than Blech Length, voids and hillocks do not easily occur at the interfaces of the first metal layers 11 and the second metal layer 12. Consequently, the lifetime of the wirings can be substantially improved.

Furthermore, in the connection between the bonding pad 10 and the first metal layers 11, since the length of the bonding pad 10 is relatively long (typically about 50–100 $\mu$m), the length may be longer than Blech Length. As a result, hillocks and voids may occur at the side of the bonding pad 10. Nevertheless, since a plurality of first metal layers 11 are provided, if the defect occurs at only one of the plurality of first metal layers 11, the other first metal layer(s) 11 and the bonding pad 10 will still be connected to each other. Accordingly, an open-failure (breaking) of the wiring will not occur and a fatal failure will not result.

Consequently, the above structure results in an increased EM lifetime between the bonding pad 10 and the first metal layers 11, compared with the case in which only one hole is located in the neighborhood of the bonding pad. When connecting the bonding pad 10 to the plurality of first metal layers 11, it is possible to realize a long wiring lifetime.

Due to the above-mentioned two advantageous functionally effects, the lifetime of the aluminum wiring can be remarkably improved in the neighborhood of the bonding pad 10. As a result, the reliability of the semiconductor device can be improved.

Furthermore, regarding the connection to the circuit block (not shown), the bonding pad 10 is connected to the circuit block with aluminum wiring 13 which is not longer than Blech Length, or in the case of wirings 14, a plurality of sections of aluminum wiring not longer than Blech Length are connected to the metal layers 11 and 12 which have EM-resistance larger than that of aluminum. Since the length of all wirings connected to the circuit block can be made the same length or shorter than Blech Length, it is possible to overcome the decrease in lifetime caused by a failure occurring in the hole nearest to the bonding pad 10 as described in the background.

Furthermore, as to the material for the first metal layers 11 and the second metal layer 12, it is preferable that the material have an EM-resistance larger than that of aluminum. For instance, it is preferable to form such metal layers with a single-layered metal or a multiple-layered metal such as tungsten (W), copper (Cu), etc.

In particular, when forming the plurality of first metal layers 11 and the second metal layer 12 with a single layer or multiple layer of metal made of tungsten (W), both the selective tungsten (W) chemical vapor deposition system and the blanket tungsten (W) chemical vapor deposition system used in the subhalf-micron generation can be adopted as the tungsten deposition system. Accordingly, any increase of the manufacturing cost can be suppressed, and, as the result, the cost and reliability of the semiconductor device can be simultaneously improved.

Second Embodiment

Figure 2:
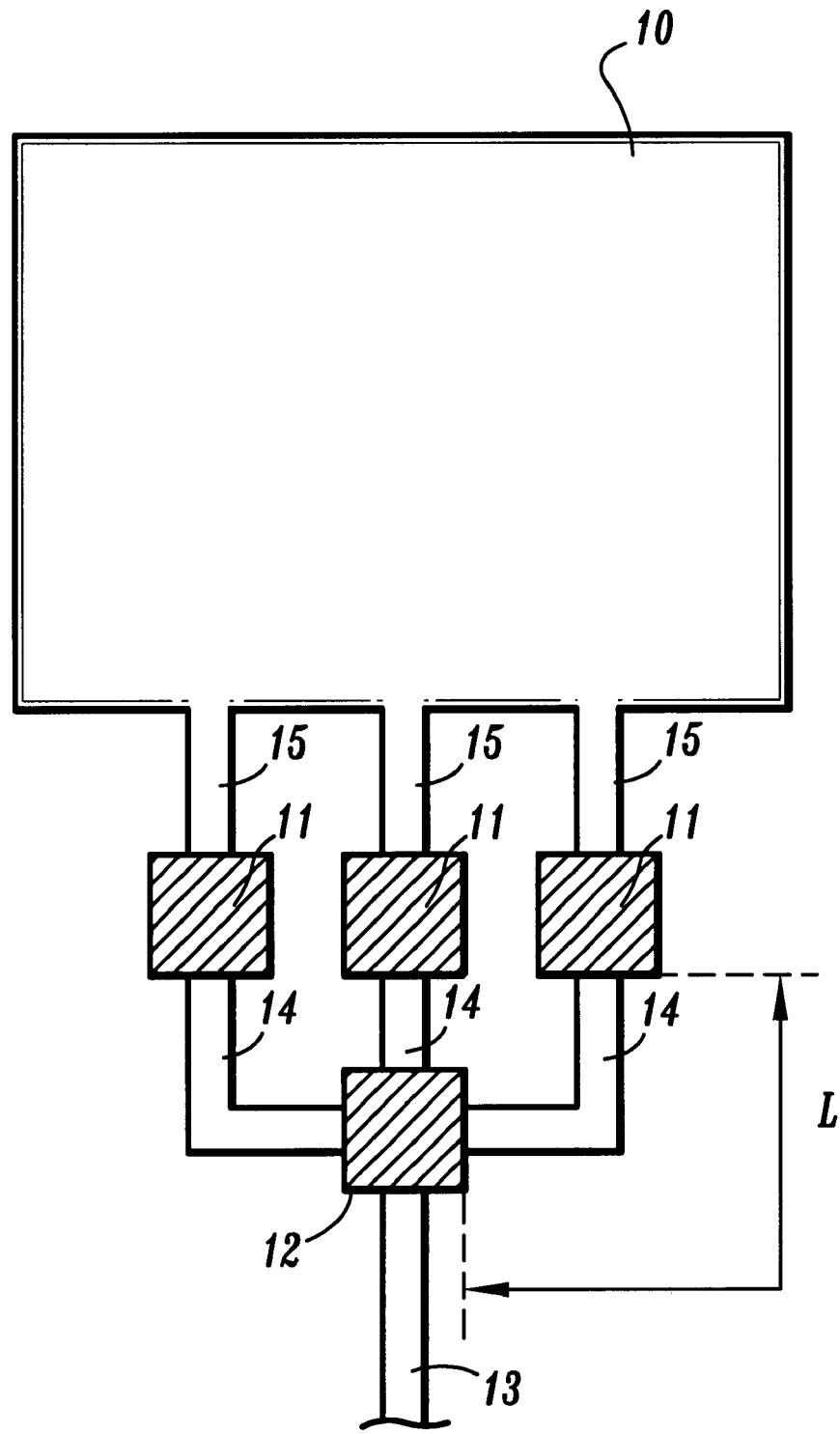
FIG. 2 is a plan view showing the second embodiment of the present invention.

FIG. 2 is a plan view showing the second embodiment of the present invention. In FIG. 2 reference numerals the same as those in FIG. 1 represent the same or similar elements.

In the second embodiment, the bonding pad 10 and the plurality of first metal layers 11, are connected to each other with a plurality of aluminum wirings 15. Furthermore, in the second embodiment, assuming that the length of the longest aluminum wiring among the plural aluminum wirings 14, between the first metal layers 11 and the second metal layer 12 is L, the length L is equal to or shorter than Blech Length.

With the structure of the second embodiment, the following functional effects can be expected in addition to the functional effects of the aforementioned first embodiment.

Generally, the voids and the hillocks occurring on the interfaces grow while the currents flow through the aluminum wirings. For this reason, the voids and the hillocks also extend to the first metal layers 11 adjacent to the interference (s) where the voids and the hillocks may occur on some occasions.

In the structure of the second embodiment, a plurality of interferences exist between the plurality of first metal layers 11 and the aluminum wirings 15. Therefore, if the voids and the hillocks occur, they may grow on only one of these interferences, and the voids and the hillocks will not extend to all of the interfaces between the first metal layer(s) 11 and aluminum wiring(s) 15. As a result, the occurrence of failure between the first metal layer(s) 11 and the aluminum wiring(s) 15 can be further suppressed. Consequently, it is possible to realize a long lifetime of the first metal layer 11 and the aluminum wiring 15.

Third Embodiment

Figure 3:
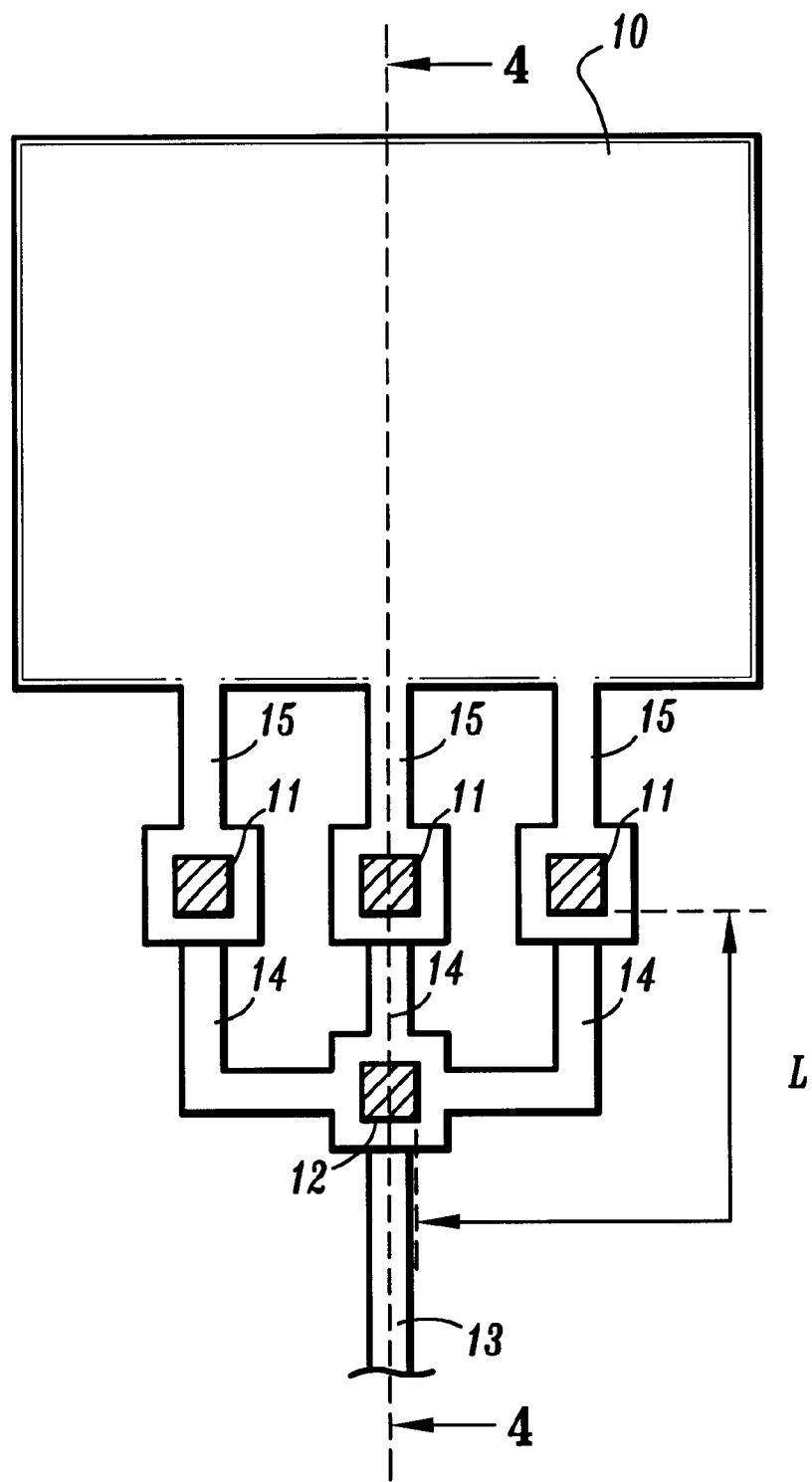
FIG. 3 is a plan view showing the third embodiment of the present invention.
Figure 4:
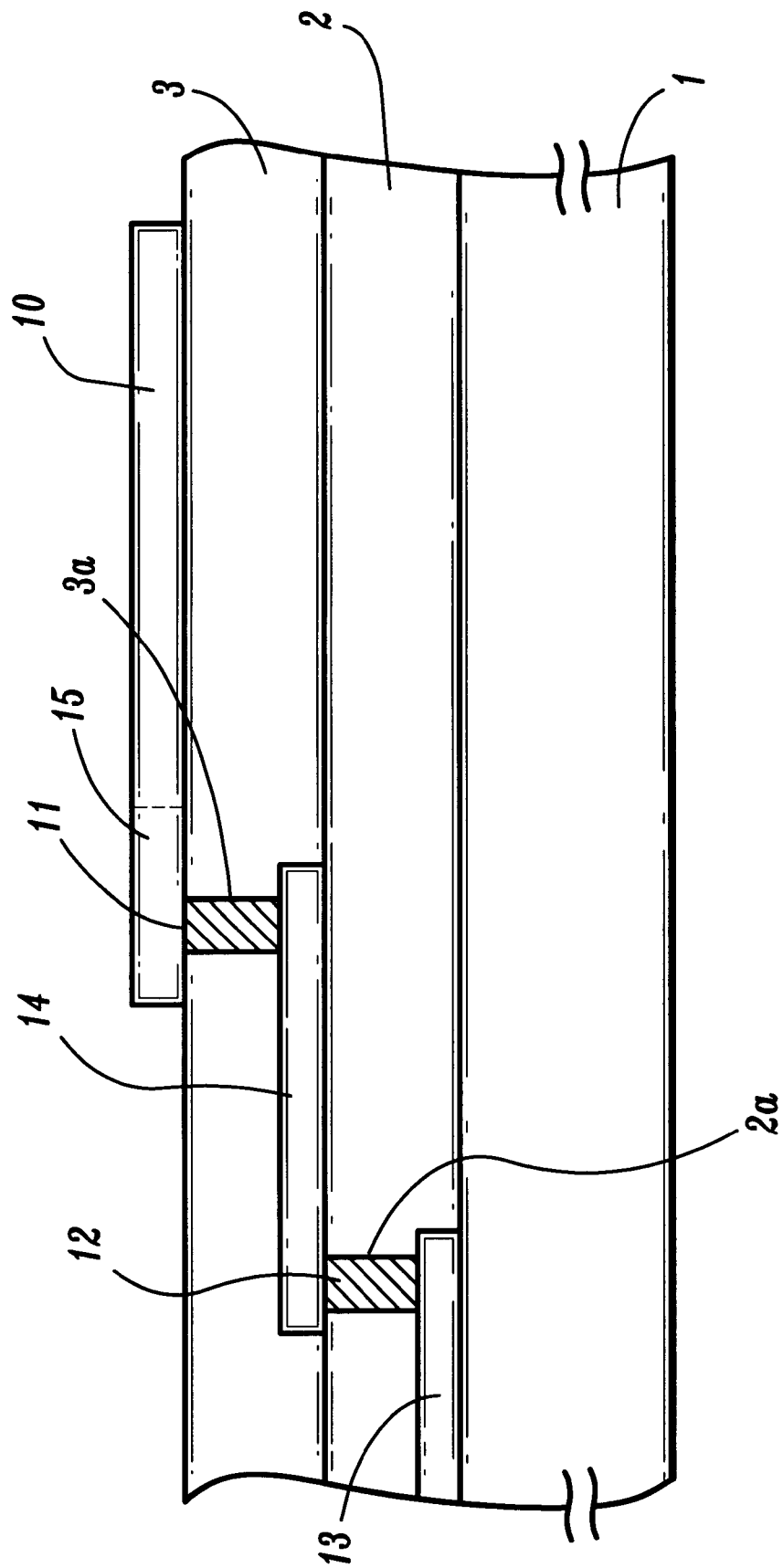
FIG. 4 is a cross-sectional view showing the third embodiment of the present invention taken along the line 4—4 in FIG. 3.

Next, the third embodiment of the present invention is described hereinafter, referring to FIG. 3 and FIG. 4. FIG. 3 is a plan view showing the third embodiment of the invention, and FIG. 4 is a cross-sectional view of the same taken along line 4—4. In the third embodiment, reference numerals the same as those in the first and second embodiments represent the same or similar elements.

In the third embodiment, the first metal layers 11 and the second metal layer 12 are constructed with the single-layered type or the multiple-layered type metal layer composed of tungsten (W) filling the holes 2a and 3a respectively formed in the different insulation films 2 and 3 on the semiconductive substrate 1. The plural aluminum wirings 14 connected to the first metal layers 11 are formed on insulation film 2 at the interface of the insulation film 3 (where the first metal layers 11 are formed) and the insulation film 2 (where the second metal layer 12 is formed). Furthermore, in the third embodiment, assuming that the length of the longest aluminum wiring among the plurality of aluminum wirings 14, between the first metal layers 11 and the second metal layer 12 is L, the length L is equal to or shorter than Blech Length.

The structure of the third embodiment can be realized by the following processes. First, the first aluminum wiring 13 for connecting to the circuit block (not shown) is formed on the semiconductive substrate 1. The first aluminum wiring 13 is then covered with insulation film 2. Next, in order to connect the first aluminum wiring 13 to the second aluminum wirings of the circuit block, via-holes (not shown) are formed in the insulation film 2, and at this time, the hole 2a which will be filed with the second metal layer 12, is formed.

Next, the second metal layer 12 is formed by filling the hole 2a with tungsten W at the time the via-holes (not shown), which connect the aluminum wiring 13 with the aluminum wiring of the circuit block, are filled with tungsten W by the blanket W process or the selective W process.

Next, a plurality of aluminum wirings 14 are formed on insulation film 2 at the time of forming second aluminum wirings of the circuit block.

Next, the second aluminum wirings including the plurality of aluminum wirings 14 are covered with insulation film 3. Then, in order to connect the second aluminum wirings to the third aluminum wirings of the circuit block, via-holes (not shown) are formed in the insulation film 3 along with holes 3a which will be filled with the first metal layers 11.

Thereafter, first metal layers 11 are formed by filling the holes 3a with tungsten W at the same time that the via-holes of the circuit block are filled with tungsten W by the blanket W process or the selective W process.

Finally, the bonding pad 10 and the aluminum wirings 15 are formed while forming the third aluminum wirings of the circuit block.

The structure of the semiconductor device according to this embodiment of the present invention can be realized without adding any new processes to the background processes, by adopting the processes as mentioned above. Consequently, any increase in manufacturing cost can be minimized and the reliability of the semiconductor device can be improved.

Furthermore, although an example of forming the first metal layers 11 and the second metal layer 12 by filling the holes 2a or 3a, respectively formed in the different insulation films 2 and 3, with tungsten W is described in the third embodiment, it may be preferable that the first metal layers 11 and the second metal layer 12 be formed by the single-layered type metal layer or a multiple-layered type metal layer composed of tungsten W filling hole 2a and holes 3a which are formed in the same insulation film.

For instance, if the circuit block is fabricated using two-layer (two levels) aluminum wirings, the structure of the third embodiment can be realized by the following processes.

At first, the aluminum wirings 14 are formed while forming the first layer or level of aluminum wirings of the circuit block on the substrate. An insulation film is then formed thereon.

Then, via-holes for connecting the first-layer aluminum wirings to the second layer or level of aluminum wirings are formed in the insulation film, and the holes for filling with the first metal layers 11 and the second metal layer 12 are formed at the same time.

Following the above process, tungsten W is used to fill the respective holes to form the first metal layers 11 and the second metal layer 12 at the same time that the via-holes are filled by the blanket W process or the selective W process.

The bonding pad 10, the aluminum wirings 15 and the aluminum wiring 13 are then formed when forming the second layer or level of aluminum wirings of the circuit block.

By adopting the above-mentioned processes, as tungsten W fills the holes formed in the single insulation film, the structure of the semiconductor device according to the present invention can be realized without adding any new processes to the background processes.

Fourth Embodiment

Figure 5:
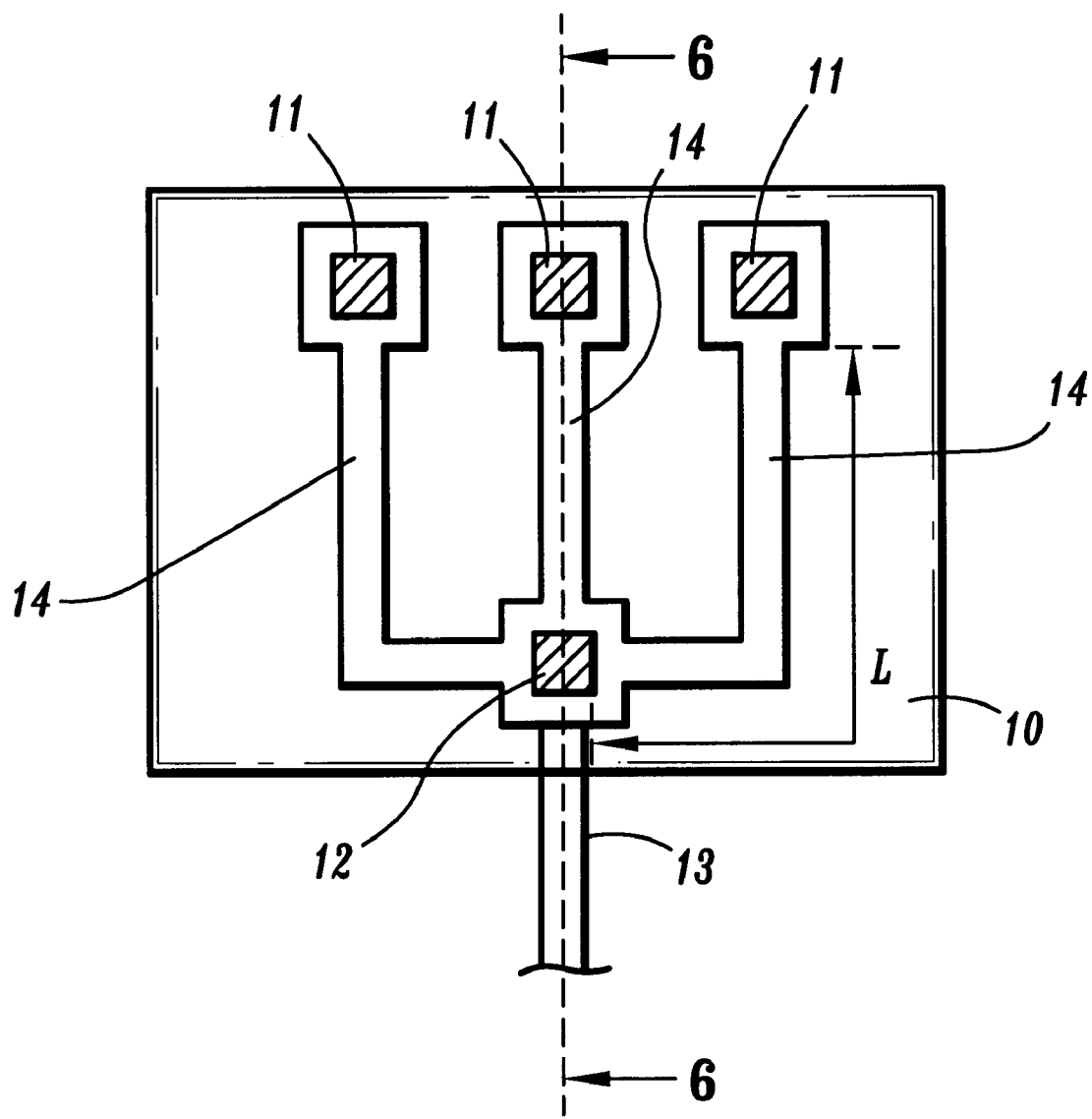
FIG. 5 is a plan view showing the fourth embodiment of the present invention.
Figure 6:
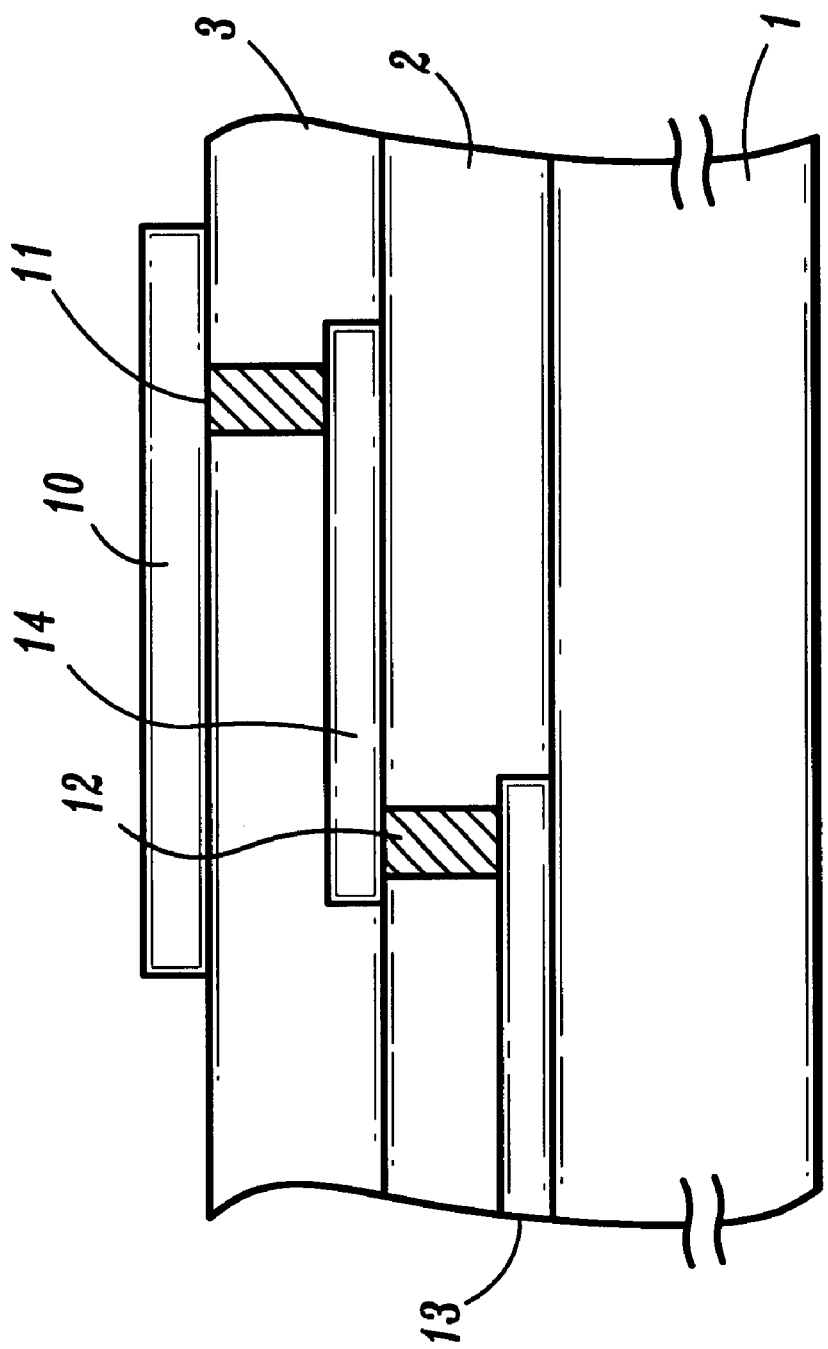
FIG. 6 is a cross-sectional view showing the fourth embodiment of the present invention taken along line 6—6 in FIG. 5.

The fourth embodiment of the present invention is described hereinafter, referring to FIG. 5 and FIG. 6. FIG. 5 is a plan view showing the fourth embodiment, and FIG. 6 is a cross-sectional view showing the same taken along lines 6—6 of FIG. 5. In the fourth embodiment, reference numerals the same as those in the first through third embodiments represent the same or similar elements.

As shown in FIGS. 5 and 6, the plurality of aluminum wirings 14 connected to the first metal layers 11, the first metal layers 11, and the second metal layer 12 are located under the bonding pad 10 and in the area occupied by the bonding pad 10. By adopting such structure, since all elements of the structure (first metal layers 11, second metal layer 12, and aluminum wirings 14) capable of realizing the advantageous functional effect of the present invention are formed under the bonding pad 10, the area for forming such structure does not widen at all, compared with the background bonding pad (the area for forming the background structure). For this reason, if the present invention is adopted in the background semiconductor device, it may be sufficient to modify only the lay-out patterns for the bonding pads tp achieve the effect shown in the fourth embodiment, and thereby the modification of the lay-out may become very simple. In other words, the original CAD data information, except for the lay-out patterns of the bonding pad, can be utilized. Consequently, the cost of the modification of the lay-out can be minimized and a long lifetime of the semiconductor device can be realized.

Fifth Embodiment

In the first through fourth embodiments as mentioned heretofore, the plural aluminum wirings 14 are connected to a single second metal layer 12. However, in the alternative, a plurality of second metal layers 12 can be utilized. However, the length L of the longest wiring among the plurality of aluminum wirings 14 connected to metal layers 12 should still be equal to or shorter than Blech Length.

In the fifth embodiment of the present invention as illustrated in FIG. 7, a pair of second metal layers 12 are provided. A plurality of aluminum wirings 14 connected to a plurality of first metal layers 11 are connected to each of the respective second metal layers 12, as shown. Assuming that the length of the longest wiring among the aluminum wirings 14 is L, the value L is equal to or shorter than Blech Length.

By adopting the structure of the fifth embodiment, such structure is able to provide a plurality of aluminum wirings 13. That is, this embodiment provides a plurality of connecting points to the circuit block. For this reason, it may be possible to improve the lay-out margin in the neighborhood of the bonding pad as in the case of the background semiconductor device. Therefore, it may be possible to shrink the design rule of the entire semiconductor device. As a result, the manufacturing cost can be further suppressed.

Furthermore, in the present invention, assuming that the length of the longest wiring among the aluminum wirings 14 is L, the length L needs to be equal to or shorter than Blech Length. However, in consideration of the width of the aluminum wirings and the densities of the current applied thereto utilized in the subhalf-micron generation, Blech Length can be estimated to be about 20 $\mu$m. Therefore, if the length of the aluminum wiring 14 is not longer than 20 $\mu$m, the advantageous functional effect of the present invention can be sufficiently realized.

As is apparent from the foregoing descriptions, in the semiconductor device of the present invention, since the length of the aluminum wirings is not longer than Blech Length, voids and hillocks on the interfaces of the first and second metal layers do not occur. Consequently, the lifetime of the wirings can be remarkably improved.

Furthermore, in the connection of the bonding pad to the first metal layers, the EM lifetime becomes longer because of the plurality of first metal layers, compared with the case of employing only one first metal layer. Even in the connection of the bonding pad and the first metal layer, the long lifetime of the device can be realized. For this reason, the lifetime of the aluminum wirings can be remarkably improved. As a result, the reliability of the semiconductor can be improved.

In the present invention, the first and second metal layers are composed of tungsten. Thereby, both of the selective tungsten chemical vapor deposition system and the blanket tungsten chemical vapor deposition system employed in the subhalf-micron generation as the tungsten deposition system can be used for forming the film of the first and second metal layers. By adopting such structure, an increase in manufacturing cost can be suppressed and the reliability of the semiconductor device can be improved.

Furthermore, in the present invention, if at least the circuit block is fabricated by two-or-more (level) aluminum wirings, the first and second metal layers are formed at the same time that the via-holes of the circuit block are filled with the first and second metal layers, and the plural aluminum wirings can be formed together with aluminum wirings of the circuit block at the same time, the semiconductor device of the present invention can be realized without adding new processes to the background processes. Consequently, the increase of the manufacturing cost can be further suppressed and the reliability of the semiconductor device can be improved.

Furthermore, when all of the first and second metal layers and the aluminum wirings are located under the bonding pad, the required area does not increase at all compared with that of the background bonding pad. For this reason, in the case, of adopting the present invention for the background semiconductor device, it may be sufficient only to exchange the bonding pad pattern and the modification of the lay-out may become very simple.

In the case of employing the plurality of second metal layers, it may be possible to provide plural aluminum wirings as the connecting points to the circuit block. In such structure, as in the case of the background semiconductor device, the lay-out margin in the neighborhood of the bonding pad can be improved. Thereby, it may be possible to realize a shrinkage of the design rule for the entire semiconductor device. As a result, the manufacturing cost can be further suppressed.

Other numerous embodiments or numerous modifications of the present invention are possible in light of the above teachings. It is therefore to be understood that within the scope of the appended claims, the invention may be practiced otherwise than as specifically described herein.

Having now fully described the invention, it will be apparent to one of ordinary skill in the art that many changes and modifications can be made thereto without departing from the spirit and scope of the invention as set forth herein. This application is based on Japanese Patent Application No. JPA09-335,222, filed Dec. 5, 1997, the entire contents of which are herein incorporated by reference.

What is claimed is:

1. A semiconductor device comprising:
   a bonding pad;
   a first metal layer including a plurality of separate sections each individually connected to said bonding pad;
   a second metal layer including a single section connected to a circuit block; and
   plural aluminum wirings respectively connected between said plurality of separate sections of said first metal layer and said single section of said second metal layer, the first metal layer, the second metal layer and the plural aluminum wirings being provided on a same plane,
   wherein said plural aluminum wirings have a length equal to or shorter than Blech Length.

2. A semiconductor device comprising:
   a bonding pad;
   a first metal layer including a plurality of separate sections each individually connected to said bonding pad;
   a second metal layer including a single section connected to a circuit block; and
   plural aluminum wirings respectively connected between said plurality of separate sections of said first metal layer and said single section of said second metal layer,
   wherein said first metal layer and said second metal layer are formed in respective layers of a multiple-layered type device and wherein said plural aluminum wirings have a length equal to or shorter than Blech Length.

3. The semiconductor device as defined in claim 2, wherein said plurality of separate sections of said first metal layer and said single section of said second metal layer comprise tungsten filled holes formed in same or different insulation films.

4. The semiconductor device as defined in claim 3, wherein said first metal layer and said second metal layer and said plural aluminum wirings are located under said bonding pad.

5. The semiconductor device as defined in claim 2, wherein said second metal layer comprises a plurality of filled thru holes formed in an insulation film.

6. The semiconductor device as defined in claim 2, wherein each of said plurality of said separate sections of said first metal layer is individually connected to said bonding pad via an aluminum wiring section.

7. The semiconductor device as defined in claim 2, wherein said single section of said second metal layer is connected to said circuit block via a single aluminum wiring section.

8. A semiconductor device comprising:
   bonding pad means;
   a first metal layer means including a plurality of separate sections each individually connected to said bonding pad means;
   a second metal layer means including a single section connected to circuit block means; and
   plural aluminum wiring means respectively connected between said plurality of separate sections of said first metal layer means and said single section of said second metal layer means, the first metal layer means, the second metal layer means and the plural aluminum wiring means, being provided on a same plane,
   wherein said plural aluminum wiring means have a length equal to or shorter than Blech Length.

9. A semiconductor device comprising:
   bonding pad means;
   a first metal layer means including a plurality of separate sections each individually connected to said bonding pad means;
   a second metal layer means including a single section connected to circuit block means; and
   plural aluminum wiring means respectively connected between said plurality of separate sections of said first metal layer means and said single section of said second metal layer means,
   wherein said first metal layer means and said second metal layer means are formed in respective layers of a multiple-layered type device and wherein said plural aluminum wiring means have a length equal to or shorter than Blech Length.

10. The semiconductor device as defined in claim 9, wherein said plurality of separate sections of said first metal layer means and said single section of said second metal layer means comprise tungsten filling holes formed in same or different insulation films.

11. The semiconductor device as defined in claim 10, wherein said first metal layer means and said second metal layer means and said plural aluminum wiring means are located under said bonding pad means.

12. The semiconductor device as defined in claim 10, wherein said second metal layer means comprises a plurality of filled thru holes formed in an insulation film.

13. The semiconductor device as defined in claim 9, wherein each of said plurality of said separate sections of said first metal layer means is individually connected to said bonding pad means via an aluminum wiring section.

14. The semiconductor device as defined in claim 9, wherein said single section of said second metal layer means is connected to said circuit block means via a single aluminum wiring section.

15. A semiconductor device comprising:
   a first metal layer including a plurality of separate sections each individually connected to a bonding pad; and a plurality of aluminum wirings respectively connected to said separate sections of said first metal layer, wherein said plurality of aluminum wirings have a length equal to or shorter than Blech Length and are connected to a single section of a second metal layer, and wherein the second metal layer is connected to a circuit block, the first metal layer, the second metal layer and the plural aluminum wirings being provided on a same plane.

16. A semiconductor device comprising:

a first metal layer including a plurality of separate sections each individually connected to a bonding pad; and a plurality of aluminum wirings respectively connected to said separate sections of said first metal layer, wherein said plurality of aluminum wirings have a length equal to or shorter than Blech Length and are connected to a section of a single second metal layer, and wherein the second metal layer is connected to a circuit block, wherein said first metal layer and said second metal layer are formed in respective layers of a multiple-layered type device.

17. The semiconductor device as defined in claim 16, wherein said separate sections of said first metal layer and said single section of said second metal layer comprise tungsten filled holes formed in same or different insulation film.

18. The semiconductor device as defined in claim 17, wherein said first metal layer and said second metal layer and said plural aluminum wirings are located under said bonding pad.

19. The semiconductor device as defined in claim 17, wherein said second metal layer comprises a plurality of filled thru holes formed in an insulation film.

20. The semiconductor device as defined in claim 16, wherein each of said plurality of said separate sections of said first metal layer is individually connected to said bonding pad via an aluminum wiring section.

21. The semiconductor device as defined in claim 16, wherein said single section of said second metal layer is connected to said circuit block via a single aluminum wiring section.

22. A semiconductor device comprising:

a first metal layer means including a plurality of separate sections each individually connected to bonding pad means; and a plurality of aluminum wiring means respectively connected to said separate sections of said first metal layer means, wherein said plural aluminum wiring means have a length equal to or shorter than Blech Length and are connected to a single section of a second metal layer means, and wherein the second metal layer means is connected to circuit block means, the first metal layer means, the second metal layer means and the plural aluminum wirings being provided on a same plane.

23. A semiconductor device comprising:

a first metal layer means including a plurality of separate sections each individually connected to bonding pad means; and a plurality of aluminum wiring means respectively connected to said separate sections of said first metal layer means, wherein said plural aluminum wiring means have a length equal to or shorter than Blech Length and are connected to a single section of a second metal layer means, and wherein the second metal layer means is connected to circuit block means, wherein said first metal layer means and said second metal layer means are formed in respective layers of a multiple-layered type device.

24. The semiconductor device as defined in claim 23, wherein said separate sections of said first metal layer means and said single section of said second metal layer means are tungsten filled holes formed in same or different insulation films.

25. The semiconductor device as defined in claim 24, wherein said first metal layer means and said second metal layer means and said plural aluminum wiring means are located under said bonding pad means.

26. The semiconductor device as defined in claim 24, wherein said second metal layer means comprises a plurality of filled thru holes formed in an insulation film.

27. The semiconductor device as defined in claim 23, wherein each of said plurality of said separate sections of said first metal layer means is individually connected to said bonding pad means via an aluminum wiring section.

28. The semiconductor device as defined in claim 23, wherein said single section of said second metal layer means is connected to said circuit block means via a single aluminum wiring section.

* * * * *